(12) United States Patent
Bradley

(10) Patent No.: US 8,816,672 B1
(45) Date of Patent: Aug. 26, 2014

(54) SYSTEMS AND METHODS FOR ACCOUNTING FOR RESIDUAL PASSIVE INTERMODULATION IN PASSIVE INTERMODULATION MEASURING INSTRUMENTS

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 790 days.

(21) Appl. No.: 13/095,684

(22) Filed: Apr. 27, 2011

(51) Int. Cl.
*G01R 23/00* (2006.01)
*G01R 23/16* (2006.01)

(52) U.S. Cl.
CPC .............. *G01R 23/16* (2013.01); *G01R 23/00* (2013.01)
USPC ................ 324/76.19; 324/126; 324/76.39; 324/520; 324/612; 324/624; 324/644

(58) Field of Classification Search
CPC ...... H04B 17/0085; H04B 3/46; G01R 31/11; G01R 31/2837; G01R 23/02; G01R 23/16; G01R 23/10; G01R 27/28; G01R 29/0878; G01R 33/0029; H03H 7/46; G01D 21/00; G01D 5/2448; H04L 27/10
USPC ........... 324/76.19, 650, 612, 624, 644, 76.39, 324/126, 520
See application file for complete search history.

(56) References Cited

U.S. PATENT DOCUMENTS

| | | | |
|---|---|---|---|
| 2009/0096466 A1* | 4/2009 | Delforce et al. | 324/612 |
| 2010/0052652 A1* | 3/2010 | Mitchell et al. | 324/76.19 |
| 2010/0194382 A1* | 8/2010 | Montena | 324/126 |
| 2010/0295533 A1* | 11/2010 | Kuga et al. | 324/76.39 |

* cited by examiner

*Primary Examiner* — Patrick Assouad
*Assistant Examiner* — Sean Curtis
(74) *Attorney, Agent, or Firm* — Meyer IP Law Group

(57) ABSTRACT

A system for measuring passive intermodulation (PIM) comprises a port connectable with a load and a PIM source, a test signal source providing a test signal having components of two or more frequencies, and a receiver including a phase-coherent detector to receive a reflected signal obtained at the port in response to the provided test signal. The phase-coherent detector has an output that provides a signal indicative of PIM. A reference signal source connected with the phase-coherent detector provides a reference signal derived from the test signal. A signal combiner having a first input connected with the output of the phase-coherent detector, a second input connectable with storing a measurement of residual PIM generated by the apparatus, and removes the residual PIM from the signal indicative of PIM and provides measured PIM of the PIM source at the output.

24 Claims, 5 Drawing Sheets

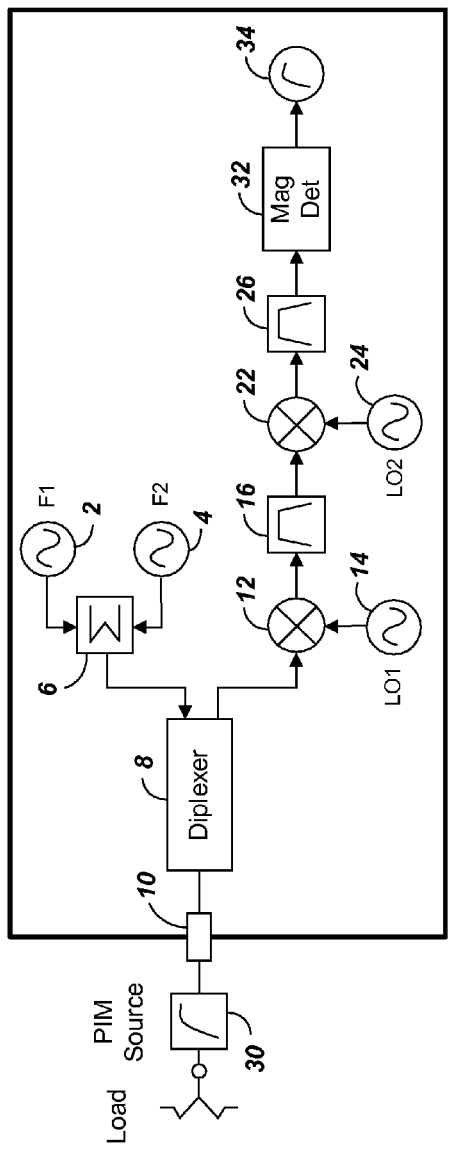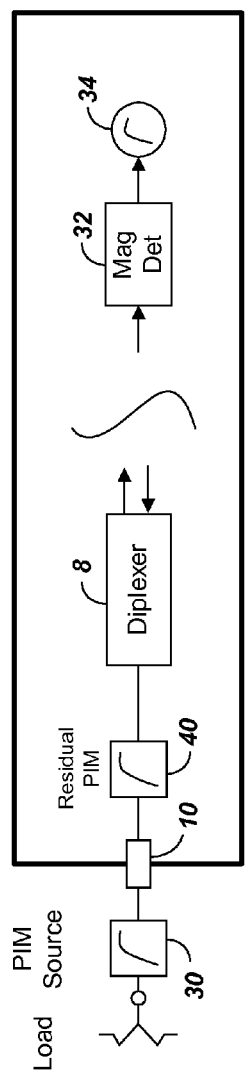

US 8,816,672 B1

SYSTEMS AND METHODS FOR ACCOUNTING FOR RESIDUAL PASSIVE INTERMODULATION IN PASSIVE INTERMODULATION MEASURING INSTRUMENTS

TECHNICAL FIELD

The present invention relates to passive intermodulation (PIM) measuring instruments and methods and systems to estimate and calibrate PIM measuring instruments for residual PIM attributable to the PIM measuring instrument itself.

BACKGROUND

Passive intermodulation (PIM) causes an unwanted signal or signals to be generated by the non-linear mixing of two or more frequencies in a passive device such as a connector or cable. PIM has surfaced as a problem for cellular telephone technologies such as Global System for Mobile Communications (GSM), Advanced Wireless Service (AWS) and Personal Communication Service (PCS) systems. Cable assemblies connecting a base station to an antenna on a tower using these cellular systems typically have multiple connectors that can act as sources of PIMs that interfere with system operation.

PIM signals are created when two signals from different systems combine and are then reflected at a PIM point such as a faulty cable connector. If the generated PIM harmonic frequency components fall within the receive band of a base station, it can effectively block a channel and make the base station receiver think that a carrier is present when one is not. Generally the components of concern are third, fifth, and seventh order, where the third order is of greatest signal strength, and therefore, of primary concern. PIMs can, thus, occur when two base stations operating at different frequencies, such as an AWS device and a PCS device, are in close proximity.

PIMs can be reduced or eliminated by replacing faulty cables or connectors. Test systems are utilized to detect PIMs enabling a technician to locate the faulty cable or connector. The test system to measure PIMs creates signals at two different frequencies, amplifies them, and provides them through cables connecting a base station to antennas on a tower for the base stations. A return signal carrying the PIMs is filtered to select a desired test frequency harmonic where PIMs can be detected and the PIM and distance to PIM measurement is provided to an operator.

FIG. 1 is a block diagram of a prior art test system setup for measuring PIM. The test system utilizes two signal sources, with a first signal source 2 producing a signal at frequency F1 and the second signal source 4 producing a signal at frequency F2. When these multiple signals are allowed to share the same signal path in a nonlinear transmission medium, the unwanted signals can occur. The third order response is particularly troublesome as it produces signals at 2F1-F2 as well as 2F2-F1. Test signals F1, F2 generated by the signal sources 2, 4 are provided to a combiner 6 to create a combined signal with frequencies F1 and F2 at the combiner output. A diplexer 8 sends the combined signal F1 and F2 to a test port 10 connected with a load and a PIM source 30. A reverse or reflected signal from port 10 is then produced at frequency 2F1-F2, and forwarded through the diplexer 8 to be down converted to an intermediate frequency. The reverse or reflected signal is output to a mixer 12, 22 where it is combined with a signal LO1, LO2 generated by a local oscillator (LO) 14, 24, and the target frequency or frequencies is selected by filtering the mixer output using a low-pass filter 16, 26. As shown, the reverse or reflected signal is down converted to a target intermediate frequency in two stages. The magnitude of the intermediate frequency signal is detected by a receiver 32 and the PIM measurement 34 is obtained.

FIG. 2 is a simplified block diagram, again showing a test signal including two or more test signal frequencies provided to a diplexer 8 that sends the test signal to a test port 10 connected with a load and a PIM source 30. However, the block diagram illustrates a further source of PIM (i.e. residual PIM) 40 within the PIM measuring instrument. There are multiple internal mechanisms in a PIM measuring instrument that can degrade over time including the test port connector, the diplexing filter, or internal crosstalk between output power amplifier sources. The presence of residual PIM can corrupt the measurement of the device being measured. Once this residual PIM reaches a limit approaching the magnitude of the PIM under test, the system becomes unusable and must be sent back to the factory for repair. It would be desirable to reduce or eliminate the influence of residual PIM on the overall PIM measurement output by the receiver.

SUMMARY OF THE INVENTION

Embodiments of the present invention are related to systems and methods for use therewith for measuring passive intermodulation (PIM). In accordance with an embodiment, a system for measuring PIM comprises a port connectable with a load and a PIM source, a test signal source providing a test signal having components of two or more frequencies, and a receiver including a phase-coherent detector to receive a reflected signal obtained at the port in response to the provided test signal. The phase-coherent detector has an output that provides a signal indicative of PIM. A reference signal source connected with the phase-coherent detector provides a reference signal. The system further comprises memory for storing a measurement of residual PIM generated by the apparatus and a signal combiner having a first input connected with the output of the phase-coherent detector, a second input connectable with the memory for storing the measurement of residual PIM, and an output. When the signal combiner is connected with memory storing a measurement of residual PIM, the signal combiner removes the residual PIM from the signal indicative of PIM and provides measured PIM of the PIM source at the output.

In a further embodiment, the reference signal source providing the reference signal to the phase-coherent detector is derivable from the test signal source. The system can further comprise a reference PIM, and the receiver can be selectably connectable with a measurement channel and a reference channel. The reference channel includes the reference PIM connected with the test signal source and the receiver and the reference signal is derivable from the test signal by connecting the receiver with the reference channel. In an embodiment, the receiver is selectably connectable with the measurement channel and the reference channel by an electronic switch.

In a further embodiment, the receiver further includes a two-stage down converter to down-convert the reflected signal to base-band. Each stage of the two-stage down converter can include, for example, a local oscillator synthesizer, a mixer, and a low pass filter.

In a further embodiment, the receiver is a synchronous receiver connected with the measurement channel and the reference channel, and the phase-detector of the synchronous receiver is a synchronous detector. In a further embodiment, the reference channel and the measurement channel each have a two-stage down converter to down-convert the reflected signal to base-band, with each stage including a mixer and a low pass filter. In such an embodiment, the first and second stages of the down converters for the reference channel and the measurement channel can optionally have common local oscillators.

In an embodiment, a system for measuring PIM comprises a port connectable with a load, a test signal source, and a receiver including a phase-coherent detector. The test signal source includes a first signal source for generating a first signal having a first frequency, and a second signal source for generating a second signal having a second frequency, and the system further comprises a combiner for generating a test signal from the first signal and the second signal having a combined signal with components of a first frequency and of a second frequency. The combiner can have a first input connected to the first signal source, a second input connected to the second signal source, and an output connected to a diplexer for providing the test signal. The diplexer is connected with the port and the test signal source and is adapted to multiplex a measurement signal obtained at the port and the test signal provided by the test signal source. The system further comprises a reference signal source connected with the phase-coherent detector providing to the phase-coherent detector a reference signal having a reference frequency derivable from the test signal. The phase-coherent detector of the system has an output that provides a signal indicative of total PIM. The system further comprises a signal combiner having a first input connected to the output of the phase-coherent detector, a second input connectable to memory storing the measurement of residual PIM, and an output. When the second input of the signal combiner is disconnected from the memory and the port is connected directly with a load without an intervening PIM source, the output of the signal combiner is a measurement of residual PIM generated by the system. When the second input of the signal combiner is connected to the memory storing the measurement of residual PIM and the port is connected with a load with an intervening PIM source, the output of the signal combiner provides a signal subtracting the residual PIM from the signal output by the phase-coherent detector to provide a signal indicative of measured PIM of the intervening PIM source between the load and the port.

In a further embodiment, the system comprises a first local oscillator for generating a first low frequency signal, a first mixer for receiving the first low frequency signal and the multiplexed signal from the diplexer to generate a first intermediate frequency (IF) signal, a first bandpass filter to filter the first IF signal, a second local oscillator for generating a second low frequency signal, a second mixer for receiving the second low frequency signal and the filtered first IF signal to generate a second IF signal, and a second bandpass filter to filter the second IF signal. The phase-coherent detector is connected to an output of the second bandpass filter.

In accordance with an embodiment, a method for measuring PIM comprises using an apparatus to measure PIM, connecting a load with a port of the apparatus without an intervening PIM source, and obtaining a measurement of residual PIM generated by the apparatus. The obtained measurement of residual PIM is stored in memory of the apparatus. An intervening PIM source is connected between the load and the port and a signal subtracting the residual PIM accessed via the memory from the total PIM detected by the apparatus is obtained providing a signal indicative of measured PIM of the intervening PIM source between the load and the port.

In a further embodiment, the method comprises using an apparatus including a port, a test signal source providing a test signal having a test frequency, and a phase-coherent detector to receive a measurement signal. The apparatus can further include a diplexer connected with the port and the test signal source to multiplex the measurement signal obtained at the port and the test signal provided by the test signal source. A reference signal source connected with the phase-coherent detector can provide a reference signal having a reference frequency to the phase-coherent detector. The apparatus can further include memory for storing a measurement of residual PIM generated by the apparatus, and a signal combiner having a first input connected to the output of the phase-coherent detector, a second input connectable to the memory for storing the measurement of residual PIM, and an output. The method further comprises connecting a load with the port of the apparatus without an intervening PIM source and obtaining a measurement of residual PIM generated by the apparatus at the output of the signal combiner. The obtained measurement of residual PIM is stored in the memory, and the memory is connected to the second input of the signal combiner. An intervening PIM source is connected between the load and the port and a signal subtracting the residual PIM from the signal output by the phase-coherent detector to provide a signal indicative of measured PIM of the intervening PIM source between the load and the port is obtained at the output of the signal combiner.

This summary is not intended to summarize all of the embodiments of the present invention. Further and alternative embodiments, and the features, aspects, and advantages of the embodiments of invention will become more apparent from the detailed description set forth below, the drawings and the claims.

BRIEF DESCRIPTION OF THE DRAWINGS

Further details of the present invention are explained with the help of the attached drawings in which:

FIG. 1 is a block diagram of components of a prior art test system setup for measuring passive intermodulation (PIM);

FIG. 2 is a simplified diagram of a prior art test system setup for measuring PIM, the test system setup including system generated, residual PIM.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout, except that the first digit of a three-digit reference number identifies the embodiment described. Like parts or elements may be described in a single embodiment, or they may be described in multiple embodiments.

As shown in FIGS. 1 and 2, a receiver for use in standard PIM measurements can be a single channel heterodyned down convert-to-base band design. Magnitude only results are displayed as an absolute PIM measurement. Residual PIM will appear as a magnitude above the receiver noise floor and depending on its contribution, can approach the magnitude of the PIM being measured. If a known good load having no PIM is connected at the test port 10, a measurement of residual PIM can be obtained at the receiver. However, such an approach treats residual PIM as a magnitude-only signal. A length of transmission line connected between a PIM source 30 and the test port 10 causes the phase of the measured signal to change and the residual PIM measurement to drift and become invalid for use in determining the portion of the PIM measured by the receiver that is attributable to the PIM source.

Figure 3A:
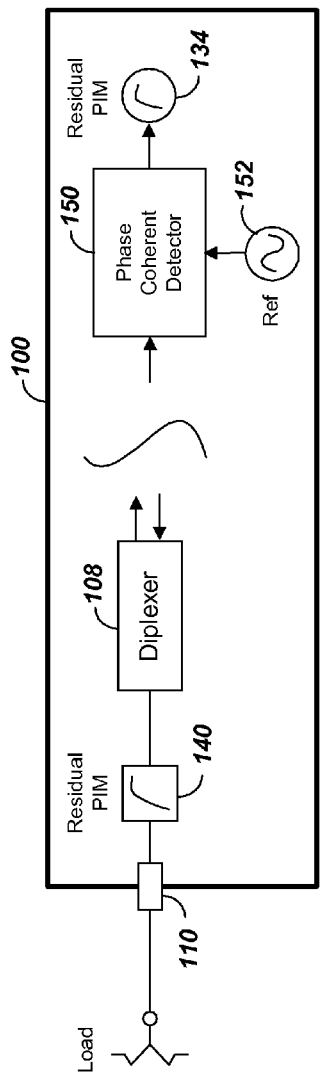
FIG. 3A is a simplified block diagram of an embodiment in accordance with the present invention of a system and a method of determining instrument-generated, residual PIM from PIM measurements obtained using the system.
Figure 3B:
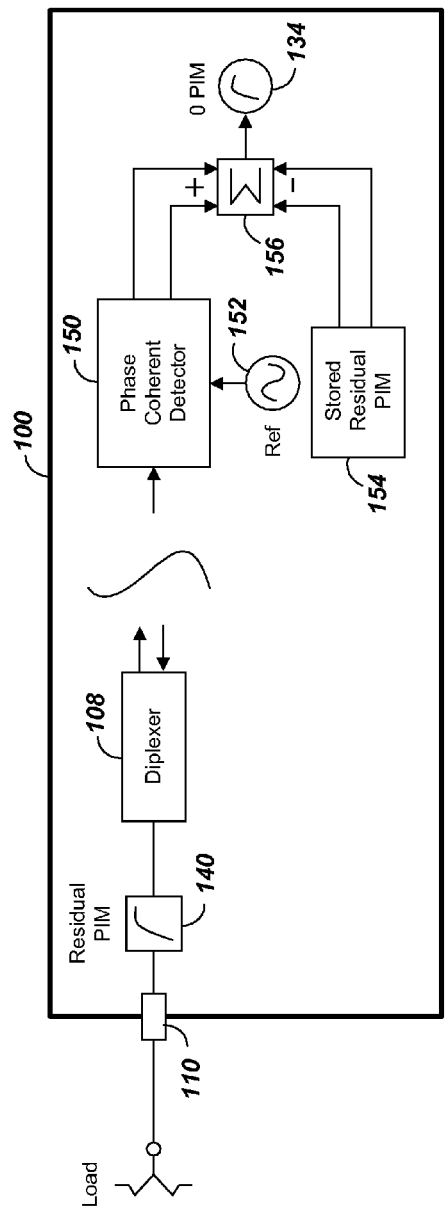
FIG. 3B is a simplified block diagram of the embodiment of FIG. 3A, further including components for removing the instrument generated, residual PIM from a PIM measurement obtained by the system.
Figure 3C:
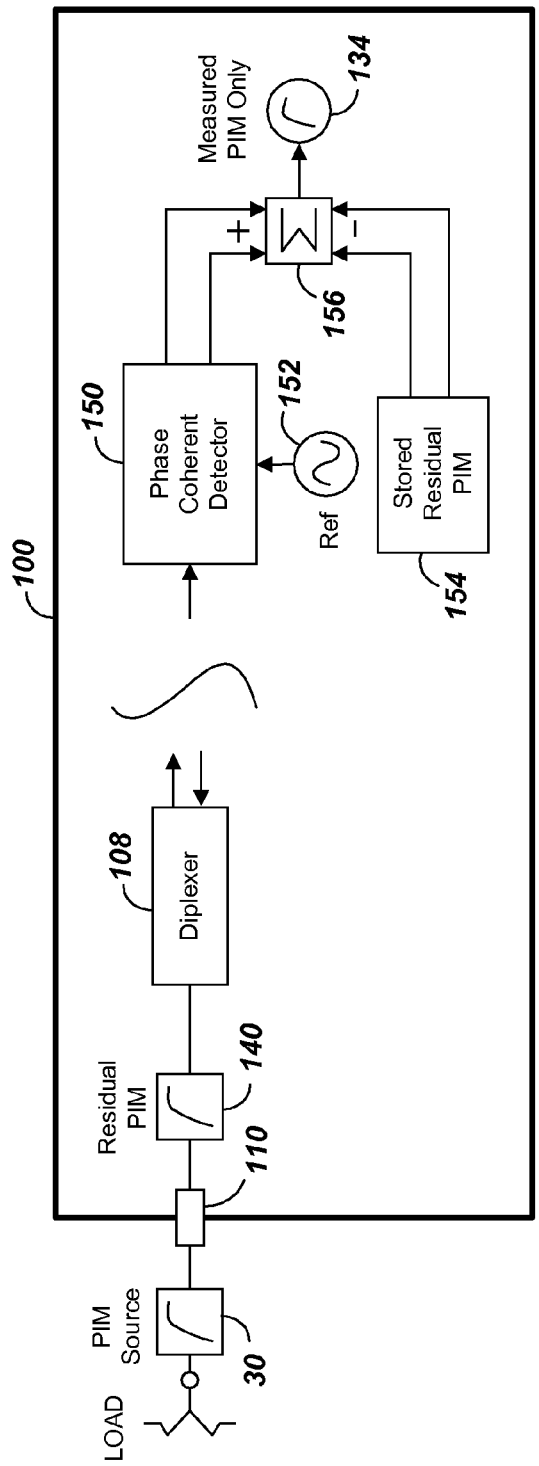
FIG. 3C is a simplified block diagram of the embodiment of FIGS. 3A and 3B, further including components for removing the instrument generated, residual PIM from a PIM measurement of a PIM source obtained by the system.

Embodiments of systems and methods of measuring PIM in accordance with the present invention can be applied to obtain measurements that account for and/or remove residual PIM attributable to the PIM measuring instrument of the system. Referring to FIGS. 3A-3C, an embodiment is shown wherein a receiver of the PIM measuring instrument 100 includes a phase coherent detector 150. The phase coherent detector 150 refers real and imaginary in-phase and quadrature outputs to a reference signal 152 to obtain an accurate measurement of residual PIM when the PIM measuring instrument is connected with a known good load. The embodiment can further comprise memory 154 for storing a residual PIM measurement. The memory 154 can be connected directly to the phase coherent detector 150, for example, by a switch (not shown) so that the phase coherent detector 150 can direct the residual PIM into memory 154 during the storage process. The information stored includes real and imaginary data. In some embodiments the memory may only need enough capacity to store a most recent measurement of residual PIM, which may only include 100 to 500 data points stored in floating point. In an embodiment, the memory can comprise electrically erasable programmable read-only memory (EEPROM). However, the invention should not be taken as being limited to such. The memory can comprise any data storage technology capable of allowing volatile or persistent storage and access of data. Still further, the memory can include and be used to track larger sets of data. For example, the memory can store residual PIM measurement data for a portion or the entirety of the life of the measuring instrument so that drift and/or deterioration of components of the measurement instrument can be observed.

A combiner 156 includes a first input connected with the phase detector and a second input connected with the memory. The combiner 156 is used to perform, for example, complex linear subtraction to eliminate the residual PIM from further measurements made with the PIM measuring instrument. Thus, as shown in FIG. 3B, the receiver will display and/or output a measurement 134 made on a known good load having no PIM as 0 dBc. Further, as shown in FIG. 3C, when the PIM measuring instrument is connected in-line with a PIM source 30, the receiver will display or otherwise output a measurement 134 that is indicative of the PIM associated with the PIM source 30 only. If no changes are made to the system setup which would cause a change in phase of the two or more test signals or of any components of the receiver, the residual signal will be eliminated allowing the desired PIM measurement to be made.

A system having a two stage down converter and two test signal sources, for example, can generate outputs at the receiver that are dependent on the different phases of the inputs to the phase coherent detector. A change in phase in either the two test signal sources or the down converter LO synthesizers can cause the residual PIM measurement to drift. If all signals used in the test signal sources and receiver are synchronized, then the residual PIM signal subtraction remains valid if test frequencies are changed.

Figure 4:
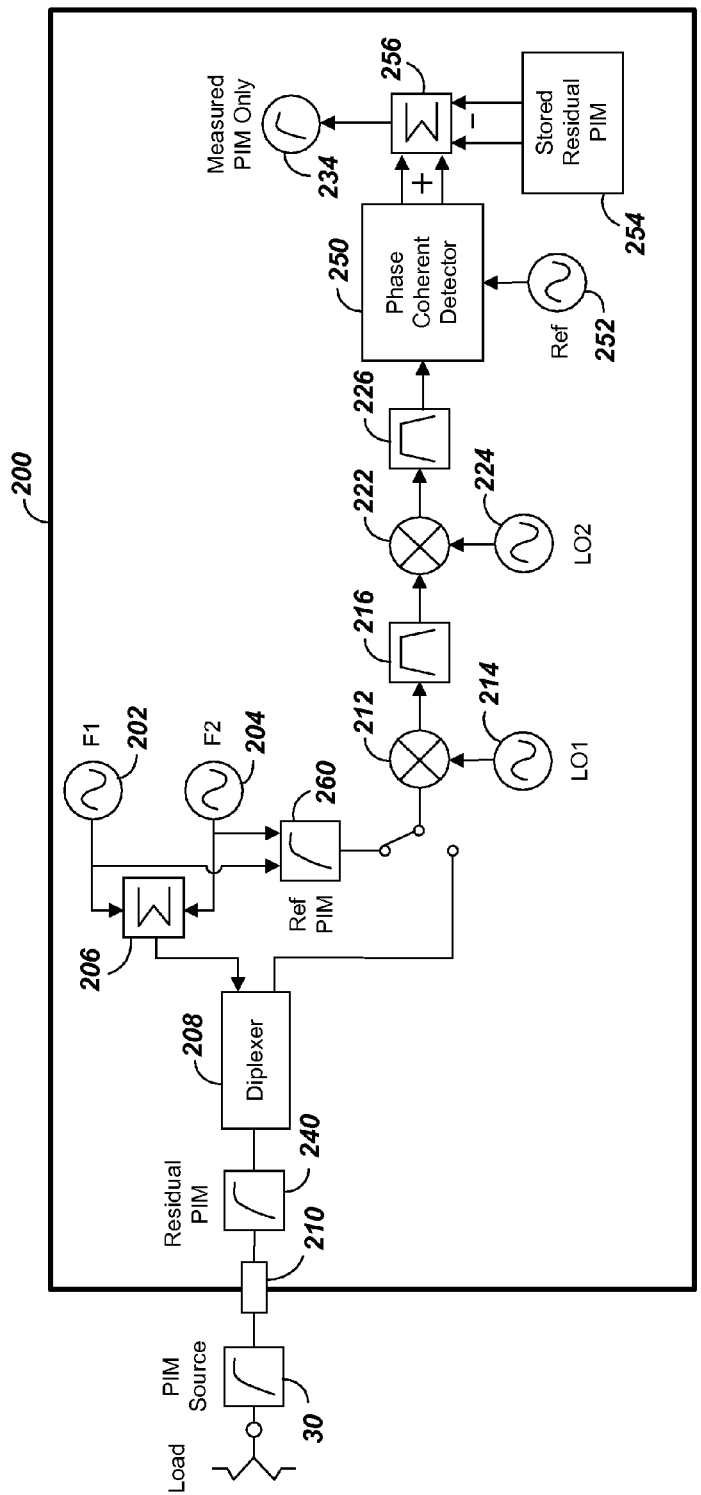
FIG. 4 is a block diagram of an embodiment of a system and a method of measuring PIM comprising a components for removing system generated, residual PIM in accordance with the present invention.

FIG. 4 illustrates a further embodiment of a system and method that can be applied to obtain measurements that account for and/or remove residual PIM attributable to the PIM measuring instrument of the system. The PIM measuring instrument 200 of the system comprises two test signal sources 202, 204 generating test signals F1, F2 that are provided to a combiner 206, and a receiver including a two-stage down converter and phase coherent detector 250, with each stage having an LO synthesizer 214, 224, a mixer 212, 222, and a low pass filter 216, 226. The receiver is selectively connectable with a measurement channel to receive reflected/returned signals from the PIM source 30, and a reference channel including the test signal sources 202, 204 connected through a reference PIM 260. The reference PIM 260 can be generated using any known technique for producing a signal that is generally stable in amplitude and phase after calibration. For example, in an embodiment the reference PIM can comprise a doubler added to one test signal source to generate a signal combinable with the other test signal source to generate 2F1-F2 and 2F2-F1 signals that are then band pass filtered to remove the undesired response. Alternatively, the reference PIM can be generated by a pair of back-to-back diodes driven into saturation creating all-order responses which are band-pass filtered to remove the undesired response.

The reference signal frequency 252 used by the phase coherent detector 250 is derivable from the two test signal source frequencies as the receiver switches back and forth between the measurement channel and the reference channel to develop a phase and magnitude representation of the two test signals with no regard to the phase relationship of the two test signals and the LO signals used to down convert the received signal. Referring to the reference PIM enables the system to cancel out the effect of the receiver on the output of the receiver. As above, a combiner 256 performs complex linear subtraction to eliminate the residual PIM measurement stored in memory 254 from measurements made with the PIM measuring instrument 200 when the PIM measuring instrument 200 is connected in-line with a PIM source 30, and the PIM measuring instrument 200 displays or otherwise outputs a measurement 234 that is indicative of the PIM associated with the PIM source 30 only.

Figure 5:
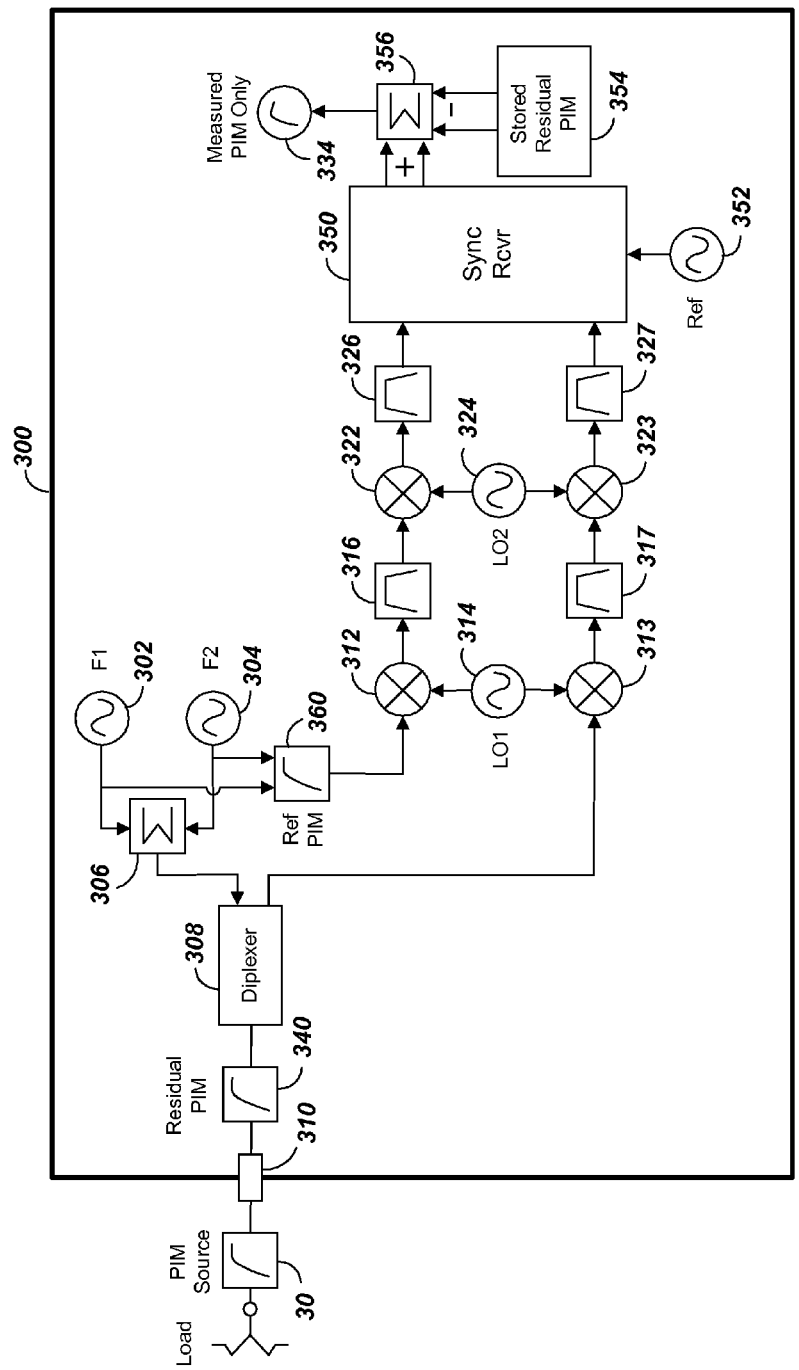
FIG. 5 is a block diagram of an alternative embodiment of a system and a method of measuring PIM comprising a components for removing system generated, residual PIM in accordance with the present invention.

FIG. 5 illustrates a further embodiment of a system and method that can be applied to obtain measurements that account for and/or remove residual PIM attributable to the PIM measuring instrument of the system. The PIM measuring instrument 300 of the system comprises two test signal sources 302, 304 generating test signals F1, F2 that are provided to a combiner 306, and a synchronous receiver 350 including a two-stage down converter and synchronous phase coherent detector, with each stage having an LO synthesizer 314, 324, a pair of mixers 312, 313, 322, 323 connected with respective reference and measurement channels, and a pair of low pass filters 316, 317, 326, 327 connected with respective reference and measurement channels. The synchronous receiver 350 is connected both to the measurement channel and the reference channel for simultaneous measurement and conversion of the two received signals. Signal processing is performed at base band using the synchronous phase coherent detector. The system noise and detection bandwidth can be efficiently reduced with averaging.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A system for measuring passive intermodulation (PIM) comprising:
   a port connectable with a load and a PIM source;
   a test signal source providing a test signal having components of two or more frequencies;
   a receiver including a phase-coherent detector to receive a reflected signal obtained at the port in response to the provided test signal;
   wherein the phase-coherent detector has an output that provides a signal indicative of PIM;
   a reference signal source connected with the phase-coherent detector and providing a reference signal;
   memory for storing a measurement of residual PIM generated by the apparatus; and
   a signal combiner having a first input connected with the output of the phase-coherent detector, a second input connectable with the memory for storing the measurement of residual PIM, and an output; and
   wherein when the signal combiner is connected with memory storing a measurement of residual PIM, the signal combiner removes the residual PIM from the signal indicative of PIM and provides measured PIM of the PIM source at the output.

2. The system of claim 1, wherein the reference signal source is derivable from the test signal source.

3. The system of claim 2, further comprising a reference PIM, and wherein:
   the receiver is selectably connectable with a measurement channel and a reference channel;
   the reference channel includes the reference PIM connected with the test signal source and the receiver; and
   the reference signal is derivable from the test signal by connecting the receiver with the reference channel.

4. The system of claim 3, wherein the receiver is selectably connectable with the measurement channel and the reference channel by an electronic switch.

5. The system of claim 1, wherein the receiver further includes a two-stage down converter to down-convert the reflected signal to base-band.

6. The system of claim 5, wherein each stage of the two-stage down converter includes a local oscillator synthesizer, a mixer, and a low pass filter.

7. The system of claim 1, wherein the test signal source includes a first signal source for generating a first signal having a first frequency, and a second signal source for generating a second signal having a second frequency, and
   further comprising a combiner for generating a test signal from the first signal and the second signal having a combined signal with components of a first frequency and of a second frequency.

8. The system of claim 1, further comprising a load connectable with the port and having no sources of PIM.

9. The system of claim 2, further comprising a reference PIM, and wherein:
   the receiver is a synchronous receiver connected with a measurement channel and a reference channel;
   the phase-detector of the synchronous receiver is a synchronous detector;
   the reference channel includes the reference PIM connected with the test signal source and the receiver; and
   the reference signal is derivable from the test signal through the reference channel.

10. The system of claim 9, wherein the synchronous receiver further includes a two-stage down converter to down-convert the reflected signal to base-band.

11. The system of claim 10, wherein each stage of the two-stage down converter includes a local oscillator synthesizer, a mixer associated with the measurement channel, a low pass filter associated with the measurement channel, a mixer associated with the reference channel, and a low pass filter associated with the reference channel.

12. A system for measuring passive intermodulation (PIM) comprising:
   a port connectable with a load;
   a test signal source providing a test signal having a two or more frequencies;
   a diplexer connected with the port and the test signal source;
   wherein the diplexer is adapted to multiplex a measurement signal obtained at the port and the test signal provided by the test signal source;
   a receiver including a phase-coherent detector to receive the multiplexed signal from the diplexer;
   a reference signal source connected with the phase-coherent detector and providing to the phase-coherent detector a reference signal having a reference frequency;
   wherein the reference signal is derivable from the test signal;
   wherein the phase-coherent detector has an output that provides a signal indicative of total PIM;
   memory for storing a measurement of residual PIM generated by the system; and
   a signal combiner having a first input connected to the output of the phase-coherent detector, a second input connectable to the memory for storing the measurement of residual PIM, and an output;
   wherein when the second input of the signal combiner is disconnected from the memory and the port is connected directly with a load without an intervening PIM source, the output of the signal combiner is a measurement of residual PIM generated by the system; and
   wherein when the second input of the signal combiner is connected to the memory storing the measurement of residual PIM and the port is connected with a load with an intervening PIM source, the output of the signal combiner provides a signal subtracting the residual PIM from the signal output by the phase-coherent detector to provide a signal indicative of measured PIM of the intervening PIM source between the load and the port.

13. The system of claim 12, wherein the test signal source includes a first signal source for generating a first signal having a first frequency, and a second signal source for generating a second signal having a second frequency, and
further comprising a combiner for generating a test signal from the first signal and the second signal having a combined signal with components of a first frequency and of a second frequency, the combiner having a first input connected to the first signal source, a second input connected to the second signal source, and an output connected to the diplexer for providing the test signal.

14. The system of claim 12, comprising:
a first local oscillator for generating a first low frequency signal;
a first mixer for receiving the first low frequency signal and the multiplexed signal from the diplexer to generate a first intermediate frequency (IF) signal;
a first bandpass filter to filter the first IF signal;
a second local oscillator for generating a second low frequency signal;
a second mixer for receiving the second low frequency signal and the filtered first IF signal to generate a second IF signal;
a second bandpass filter to filter the second IF signal; and
wherein the phase-coherent detector is connected to an output of the second bandpass filter.

15. The system of claim 12, further comprising a reference PIM, and wherein:
the receiver is selectably connectable with a measurement channel and a reference channel;
the reference channel includes the reference PIM connected with the test signal source and the receiver; and
the reference signal is derivable from the test signal by connecting the receiver with the reference channel.

16. The system of claim 15, wherein the receiver is selectably connectable with the measurement channel and the reference channel by an electronic switch.

17. The system of claim 12, further comprising a load connectable with the port and having no sources of PIM.

18. The system of claim 12, further comprising a reference PIM, and wherein:
the receiver is a synchronous receiver connected with a measurement channel and a reference channel;
the phase-detector of the synchronous receiver is a synchronous detector;
the reference channel includes the reference PIM connected with the test signal source and the receiver; and
the reference signal is derivable from the test signal through the reference channel.

19. The system of claim 18, wherein the synchronous receiver further includes a two-stage down converter to downconvert the reflected signal to base-band.

20. The system of claim 19, wherein each stage of the two-stage down converter includes a local oscillator synthesizer, a mixer associated with the measurement channel, a low pass filter associated with the measurement channel, a mixer associated with the reference channel, and a low pass filter associated with the reference channel.

21. A system for measuring passive intermodulation (PIM) comprising:
a port connectable with a load;
a first test signal source;
a second test signal source;
a test signal combiner having a first input connected to the first test signal source, a second input connected to the second test signal source, and an output;
a diplexer connected between the port and the output of the test signal combiner;
wherein the diplexer is adapted to multiplex a measurement signal obtained at the port and a test signal provided by the test signal combiner;
a reference PIM source connected between the first test signal source and the test signal combiner and connected between the second test signal source and the test signal combiner;
a first local oscillator (LO) for generating a first low frequency signal;
a first mixer for receiving the first low frequency signal and the multiplexed signal from the diplexer to generate a first intermediate frequency (IF) signal;
a first bandpass filter for filtering the first IF signal;
a second LO for generating a second low frequency signal;
a second mixer for receiving the second low frequency signal and the filtered first IF signal to generate a second IF signal;
a second bandpass filter to filter the second IF signal;
a third LO for generating a third low frequency signal;
a third mixer for receiving the third low frequency signal and a signal from the reference PIM source to generate a third IF signal;
a third bandpass filter to filtering the third IF signal;
a fourth LO for generating a fourth low frequency signal;
a fourth mixer for receiving the fourth low frequency signal and the filtered third IF signal to generate a fourth IF signal;
a fourth bandpass filter to filter the fourth IF signal;
a synchronous receiver connected to an output of the second bandpass filter and to an output of the fourth bandpass filter;
a reference signal source connected with the synchronous receiver and providing to the synchronous receiver a reference signal having a reference frequency;
wherein the reference signal is derived from the test signal;
wherein the synchronous receiver has an output that provides a signal indicative of total PIM;
memory for storing a measurement of residual PIM generated by the system; and
a signal combiner having a first input connected to the output of the synchronous receiver, a second input connectable to the memory for storing the measurement of residual PIM, and an output;
wherein when the second input of the signal combiner is disconnected from the memory and the port is connected directly with a load without an intervening PIM source, the output of the signal combiner is a measurement of residual PIM generated by the system; and
wherein when the second input of the signal combiner is connected to the memory storing the measurement of residual PIM and the port is connected with a load with an intervening PIM source, the output of the signal combiner provides a signal subtracting the residual PIM from the signal output by the synchronous receiver to provide a signal indicative of measured PIM of the intervening PIM source between the load and the port.

22. The system of claim 21, wherein:
the first LO and the third LO are the same LO;
the first low frequency signal and third low frequency signal are the same low frequency signal;
the second LO and the fourth LO are the same LO; and
the second low frequency signal and the fourth low frequency signal are the same low frequency signal.

23. A method for measuring passive intermodulation (PIM) comprising:
- using an apparatus to measure PIM;
- connecting a load with a port of the apparatus without an intervening PIM source;
- obtaining a measurement of residual PIM generated by the apparatus;
- wherein the obtained measurement of residual PIM is stored in memory of the apparatus;
- connecting an intervening PIM source between the load and the port; and
- obtaining a signal subtracting the residual PIM accessed via the memory from the total PIM detected by the apparatus to provide a signal indicative of measured PIM of the intervening PIM source between the load and the port.

24. A method for measuring passive intermodulation (PIM) comprising:
- using an apparatus including a port, a test signal source providing a test signal having a test frequency, a diplexer connected with the port and the test signal source to multiplex a measurement signal obtained at the port and the test signal provided by the test signal source, a phase-coherent detector to receive the multiplexed signal from the diplexer, a reference signal source connected with the phase-coherent detector and providing to the phase-coherent detector a reference signal having a reference frequency, memory for storing a measurement of residual PIM generated by the apparatus, and a signal combiner having a first input connected to the output of the phase-coherent detector, a second input connectable to the memory for storing the measurement of residual PIM, and an output;
- connecting a load with the port of the apparatus without an intervening PIM source;
- obtaining a measurement of residual PIM generated by the apparatus at the output of the signal combiner;
- wherein the obtained measurement of residual PIM is stored in the memory;
- connecting the memory to the second input of the signal combiner;
- connecting an intervening PIM source between the load and the port; and
- obtaining a signal subtracting the residual PIM from the signal output by the phase-coherent detector to provide a signal indicative of measured PIM of the intervening PIM source between the load and the port at the output of the signal combiner.

* * * * *